United States Patent [19]

Yoshida et al.

[11] Patent Number: 4,601,085
[45] Date of Patent: Jul. 22, 1986

[54] WATER-RESISTANT SLIDE FASTENER STRINGER

[75] Inventors: Hiroshi Yoshida; Yoshitoki Tsubokawa, both of Kurobe, Japan

[73] Assignee: Yoshida Kogyo K. K., Tokyo, Japan

[21] Appl. No.: 561,344

[22] Filed: Dec. 14, 1983

[30] Foreign Application Priority Data

Dec. 15, 1982 [JP] Japan ............................... 57-219562
Dec. 17, 1982 [JP] Japan ............................... 57-222676

[51] Int. Cl.⁴ ............................................. A44B 19/40
[52] U.S. Cl. .......................................... 24/384; 24/403; 24/413
[58] Field of Search ............... 24/384, 389, 387, 403, 24/413

[56] References Cited

U.S. PATENT DOCUMENTS

| | | | |
|---|---|---|---|
| 1,734,434 | 11/1929 | Hutchins | 24/384 |
| 2,296,468 | 7/1942 | Feist | 24/384 |
| 2,454,214 | 11/1948 | Sapp | 24/384 |
| 2,557,163 | 6/1951 | Williams | 24/389 |
| 2,841,851 | 7/1958 | Van Amburg | 24/205.1 |
| 2,910,754 | 11/1959 | Morin | 24/389 |
| 3,114,953 | 12/1963 | Doelter | 24/389 |
| 3,501,816 | 3/1970 | Heimberger | 24/389 |
| 4,112,150 | 9/1978 | Brown | 427/284 |
| 4,276,680 | 7/1981 | Moertel | 24/397 |
| 4,502,190 | 3/1985 | Inamura | 24/389 |

FOREIGN PATENT DOCUMENTS

| | | | |
|---|---|---|---|
| 1275156 | 9/1961 | France | 24/389 |
| 46-17976 | 5/1971 | Japan | |

Primary Examiner—William E. Lyddane
Assistant Examiner—Peter A. Aschenbrenner
Attorney, Agent, or Firm—Hill, Van Santen, Steadman & Simpson

[57] ABSTRACT

A water-resistant slide fastener stringer comprises a water-resistant support tape and a pair of rows of coupling elements mounted on opposite surfaces of the support tape. In production, the two coupling element rows are attached to one or water-resistant surface of a continuous water-resistant strip in a confronting relation to one another. Then the strip is folded into a pair of superposed strip halves along a longitudinal line between the opposed coupling element rows. Finally, the confronting inner surfaces of the strip halves are joined to one another in a known manner, e.g. by an adhesive.

8 Claims, 29 Drawing Figures

WATER-RESISTANT SLIDE FASTENER STRINGER

BACKGROUND OF THE INVENTION

1. Field of the Invention

The present invention relates to a water-resistant slide fastener suitable for ski wear, sports bags, camping tents, etc. which require good resistance against rain and snow.

2. Prior Art

A known water-resistant slide fastener stringer, as disclosed in Japanese Patent Publication No. 46-17976, comprises a support tape and a row of coiled coupling elements mounted on one surface of the support tape; the support tape and the couping element row are covered by a layer of water-resistant elastomeric material. Such prior slide fastener is not suitable for sports bags, for example, because confronting contact edges of the opposed support tapes tend to be easily disengaged from one another when thrusting force is exerted on the support tapes from the interior of the bag due to overpacking, causing inadequate water-tightness.

U.S. Pat. No. 2,841,851 discloses a water-resistant slide fastener which comprises a pair of opposed sealing members of water-resistant elastomeric material, a pair of opposed upper stringers attached to the sealing members on respective upper surfaces thereof, and a pair of opposed lower stringers attached to the sealing members on respective lower surfaces thereof. Although it guarantees adequate water-tightness, the prior slide fastener has a very complex structure and therefore is not suitable for ski wear, sports bags, or camping tents which must be minimized in weight. Further, such complex slide fastener cannot be produced at low cost.

U.S. Pat. No. 4,112,150 discloses a method of manufacturing a continuous water-resistant slide fastener stringer. The prior method, however, comprises complicated and hence laborious processing steps which must be performed meticulously with a large scale and complex apparatus. With this method, it is difficult to coat water-resistant material over both the support tape and the coupling elements evenly. Therefore, satisfactory and uniform quality water-resistant slide fasteners cannot be produced.

SUMMARY OF THE INVENTION

According to the present invention, a water-resistant slide fastener stringer comprises a water-resistant support tape and a pair of rows of coupling elements mounted on opposite surfaces of the support tape. In production, the two coupling element rows are attached to one or water-resistant surface of a continuous water-resistant strip in confronting relation to one another. Then the strip is folded into a pair of superposed strip halves along a longitudinal center between the opposed coupling element rows. Finally, confronting inner surfaces of the strip halves are joined together in a known manner, e.g. by an adhesive.

It is therefore an object of the invention to provide a water-resistant slide fastner particularly suitable for ski wear, sports bags, camping tents, etc. which require good resistance against rain and snow.

Another object of the invention is to provide a durable water-resistant slide fastener which is simple in construction and hence inexpensive.

Still another object of the invention is to provide a water-resistant slide fastner which will maintain adequate water-tightness between confronting contact edges of opposed support tapes even when thrusting force is exerted on the tapes in either facewise direction.

Many other objects, features and additional advantages of the present invention will become manifest to those versed in the art up making reference to the detailed description and the accompanying sheets of drawings in which preferred structural embodiments incorporating the principles of the present invention are shown by way of illustrative example.

DETAILED DESCRIPTION

Figure 1:
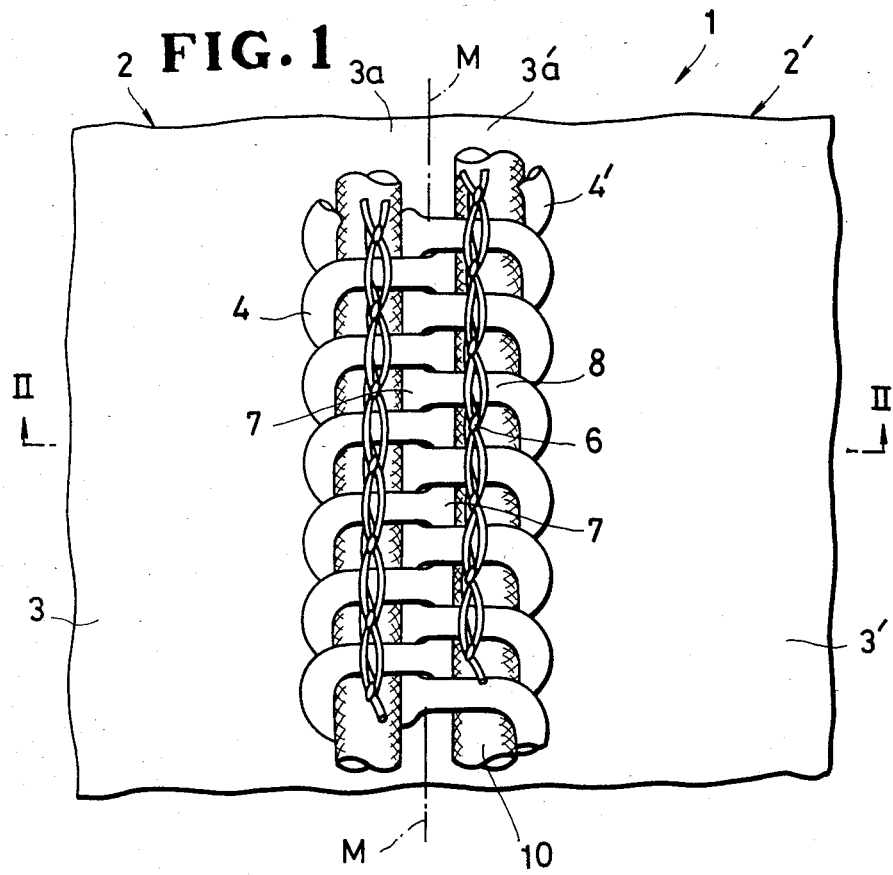
FIG. 1 is a fragmentary plan view of a water-resistant slide fasteners embodying the present invention.
Figure 2:
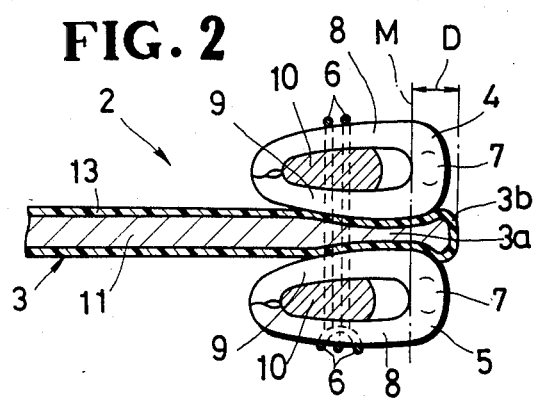
FIG. 2 is a transverse cross-sectional view taken along line II—II of FIG. 1, showing only one water-resistant fastener stringer.

FIG. 1 shows a water-resistant slide fastner 1 comprising a pair of slide fastener stringers 2, 2' (hereinafter referred to as "water-resistant stringers"). As shown in FIG. 2, each water-resistant stringer 2 includes a water-resistant support tape 3 and a pair of upper and lower rows of coupling elements 4, 5 mounted on opposite surfaces of the support tape 3 along a longitudinal marginal portion 3a thereof, the upper and lower coupling element rows 4, 5 being engageable with a pair of corresponding coupling element rows 4', 5', respectively, of the like companion stringer 2' across an imaginary center line M of mutual engagement. The marginal portion 3a of each water-resistant support tape 3 has a contact edge 3b that is engageable with a corresponding contact edge 3b of the companion stringer's support tape 3' to effect a water-tightness between such two stringers 2, 2'. The contact edge 3b in its free form projects beyond the center line M by a predetermined distance D.

Each row of coupling elements 4, 5 comprises a continuous coiled filament of synthetic resin attached to the support tape 3 by sewn stitches 6 of "double locked stitch" passing through a pair of reinforcement cores 10,10 and the support tape 3, each reinforcement core 10 extending longitudinally through the successive coiled coupling elements of a respective row 4, 5.

The support tape 3 comprises a continuous core web or strip 11 of cloth covered on its whole surface by a layer 13 of water-resistant material such as natural or synthetic rubber or other elastomeric synthetic resin.

Figure 3:
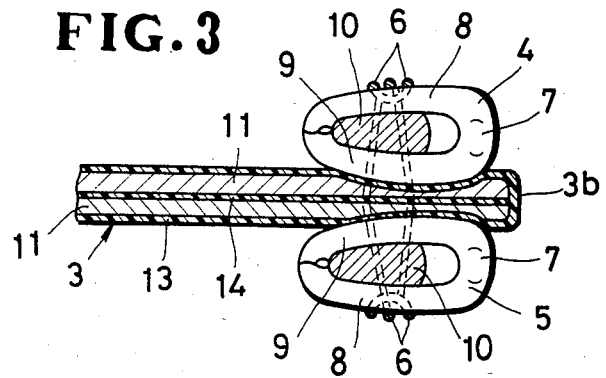
FIGS. 3 through 11 are transverse cross-sectional views showing various modifications of the water-resistant fastener stringer of FIG. 2, each of FIGS. 6 and 11 illustrating the same having been interengaged with a like companion stringer.

FIG. 3 shows a water-resistant stringer 2 according to a second embodiment in which the support tape 3 comprises a pair of superposed strips 11, 11 of cloth, each strip being covered on its whole surface except one or inner surface by the water-resistant layer 13. In production, each coupling element row 4, 5 is mounted on the outer or covered surface of a respective one of the upper and lower strips 11, 11 by sewn stitches 6. Then a film 14 of thermoplastic synthetic resin is sandwiched between the two strips 11, 11 and is attached at opposite faces to the inner or non-covered surfaces of the two strips 11, 11 in a well known manner such as by applying heat and pressure. Alternatively, the inner confronting surfaces of the two strips 11, 11 may be bonded to one another by an adhesive.

Figure 4:
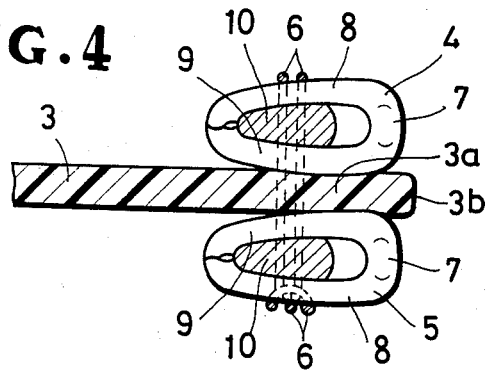

FIG. 4 shows a third embodiment in which the support tape 3 comprises a single strip of water-resistant material such as natural or synthetic rubber or other elastomeric synthetic resin.

Figure 5:
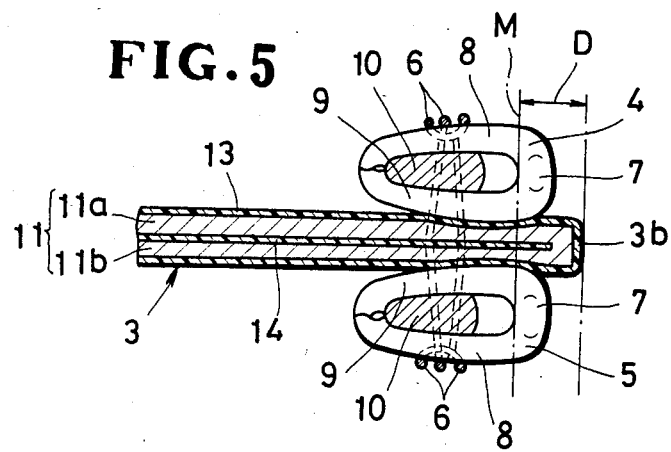
Figure 12:
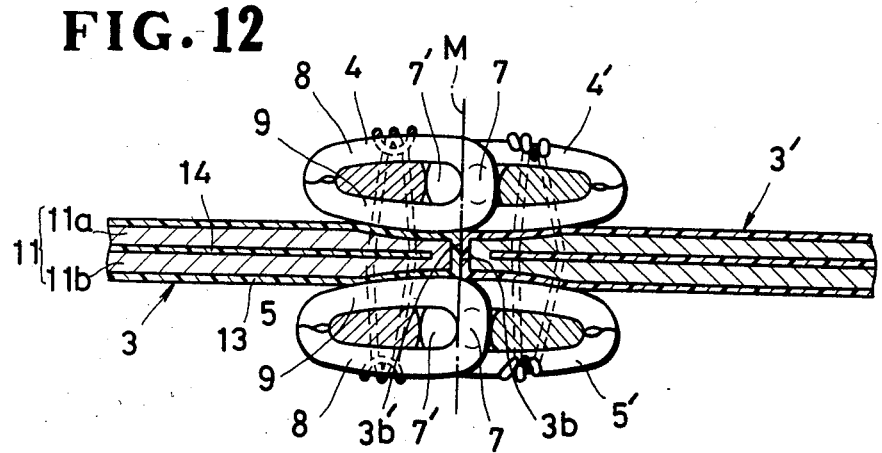
FIG. 12 illustrates the water-resistant stringer of FIG. 5 as having been interengaged with a like companion stringer.

FIG. 5 shows a fourth embodiment in which the support tape 3 comprises a continuous core web or strip 11 of clothfolded on itself into a pair of superposed strip halves 11a, 11b and covered on the whole surface, except the inner surface, of each strip half 11a, 11b by the water-resistant layer 13. Each row of coupling elements 4, 5 is mounted on the outer or covered surface of the respective strip half 11a, 11b by sewn stitches 6. A film 14 of thermoplastic synthetic resin is sandwiched between the two strip halves 11a, 11b and is attached at opposite surfaces to the inner or non-covered surfaces of the two strip halves 11a, 11b in a well known manner such as by applying heat and pressure. Alternatively, the inner confronting surfaces of the two strip halves 11a, 11b may be bonded to one another by an adhesive. FIG. 12 illustrates the water-resistant stringer 2 of FIG. 5 as interengaged with a like companion stringer 2'.

Figure 6:
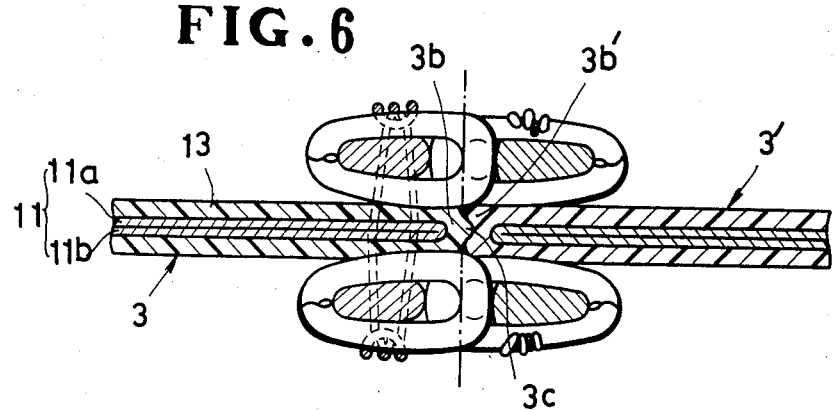

FIG. 6 shows a pair of water-resistant stringers 2, 2' according to a fifth embodiment in which the support tape 3 of each stringer comprises a core web or strip 11 of cloth folded on itself into a pair of superposed strip halves 11a, 11b and covered on the whole surface, except inner surface, of each strip half 11a, 11b by a layer 13 of water-resistant elastomeric material preferably comprising soft polyvinyl chloride. The inner confronting surfaces of the two strip halves 11a, 11b may be bonded to one another by an adhesive. The support tape 3 has a projection 3c made of hard polyvinyl chloride and formed integrally with the layer 13 of soft polyvinyl chloride by extrusion-molding. When the opposed stringers 2, 2' are interengaged, the projection 3c of one support tape 3 penetrates into the contact edge 3b' of the other support tape 3', thereby forming a longitudinal recess therein and causing an improved water-tightness between the opposed support tapes 3, 3'.

Figure 7:
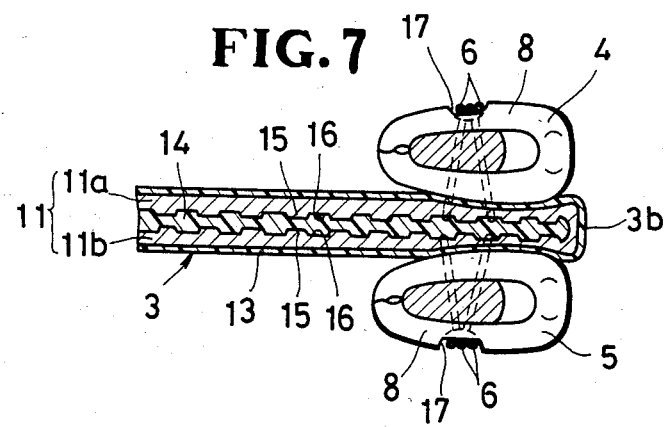

FIG. 7 shows a sixth embodiment in which the support tape 3 comprises a strip 11 of warp-knit fabric folded on itself into a pair of superposed strip halves 11a, 11b and covered on the outer surface of each strip half 11a, 11b by the water-resistant layer 13, the knit fabric being composed of tricot stitches forming on the inner or non-covered surface of each strip half 11a, 11b a plurality of longitudinal wales 15 and interwale grooves 16. The sewn stitches 6 extend through a transverse recess 17 in the upper leg 8 of the individual coupling element 4, 5 and through the warp-knit fabric strip half 11a, 11b at interwale grooves 16, causing firm attachment of the coupling element rows 4, 5. A film 14 of thermoplastic synthetic resin is sandwiched between the two strip halves 11a, 11b and is attached at opposite surfaces to the inner or waled surfaces of the two strip halves 11a, 11b by applying heat and pressure.

Figure 8:
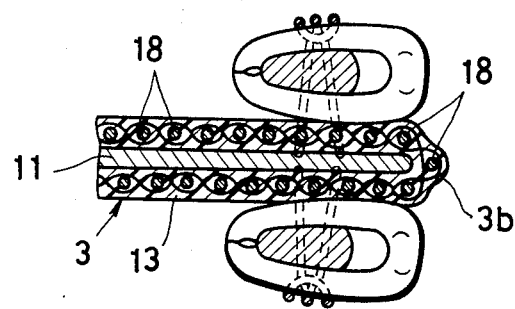

FIG. 8 shows a seventh embodiment, the support tape 3 comprises a core web or strip 11 of cloth covered by a layer 13 of water-resistant elastomeric material, and a plurality of longitudinal reinforcing threads 18 embedded in the water-resistant layer 13.

Figure 9:
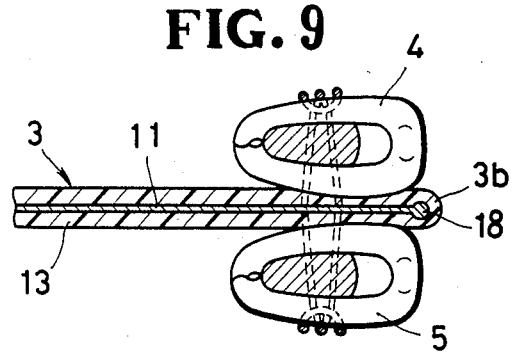

In an eighth embodiment shown in FIG. 9, the support tape 3 comprises a core web or strip 11 of cloth covered by a layer 13 of water-resistant elastomeric material, and a single longitudinal reinforcing thread 18 embedded in the water-resistant layer 13 along the contact edge 3b.

Figure 10:
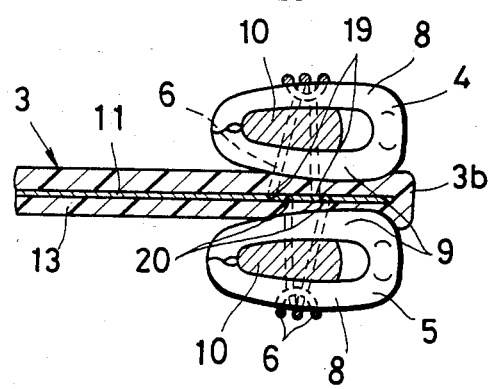

FIG. 10 shows a ninth embodiment in which the support tape 3 comprises a core web or strip 11 of cloth covered by a layer 13 of water-resistant elastomeric material. The sewn stitches 6 attaching the upper row of coupling elements 4 penetrate through the upper layer half at 19, while the sewn stitches 6 attaching the lower row of coupling elements 5 penetrate through the lower layer half at 20, the position 19 being out of alignment with the position 20 in a facewise direction of the support tape 3 so as not to allow the penetration of water through the support tape 3 along the needle threads of the upper and lower sewn stitches 6 due to capillarity.

Figure 11:
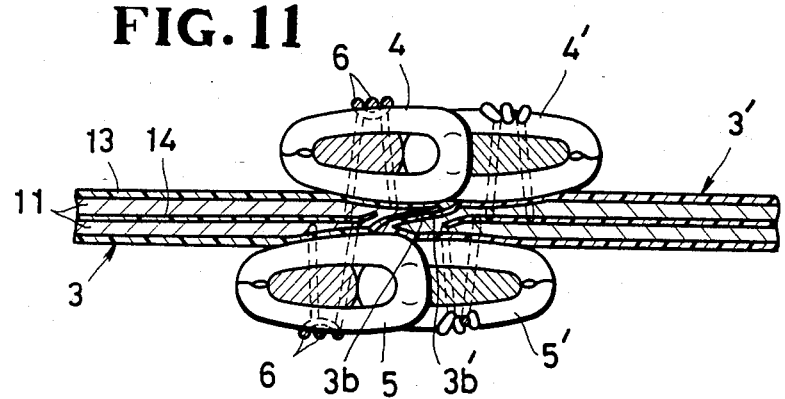

FIG. 11 shows a tenth embodiment in which the upper row of coupling elements 4 is out of alignment with the lower row of coupling elements 5 in a facewise direction of the support tape 3 and in which the support tape 3 has an inclined contact edge 3b complementary in shape to a corresponding contact edge 3b' of the companion support tape 3'. With this arrangement, the contact edges 3b, 3b' of the opposed support tapes 3, 3' are engageable with one another with an improved water-tightness.

Figure 13:
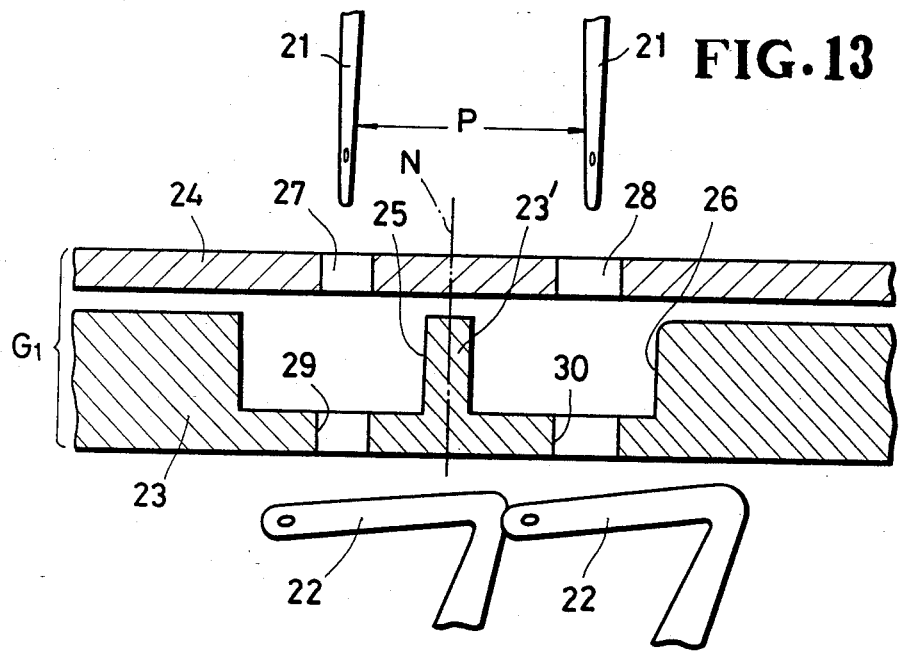
FIG. 13 is a fragmentary transverse cross-sectional view of a guide for supporting a continuous water-resistant strip and a pair of rows of coupling elements while the latter is sewn to the strip on a sewing machine (only sewing needles and loopers of the machine are shown)

The water-resistant stringer 2 of each of FIGS. 5–10 may be produced in the following manner, using a guide G1 (FIG. 13) for supporting a continuous water-resistant strip 3 and a pair of rows of continuous coiled coupling elements 4, 5 while the latter is sewn to the water-resistant strip on a sewing machine (only sewing needles 21 and loopers 22 of the machine are illustrated for clarity).

The guide G1 comprises an elongate horizontal lower plate 23 for supporting on its upper surface the water-resistant strip 3, and an upper plate 24 coextensive with and parallel to the lower plate 23, the upper and lower plate 24, 23 jointly defining therebetween a longitudinal guide passage for the water-resistant strip 3. The lower plate 23 has in its upper surface a pair of longitudinally extending parallel guide grooves 25, 26 for receiving a pair of rows of coupling elements 4, 5, respectively, the two guide grooves 25, 26 being separated by a partition 23′. Designated at N is a center line of the guide G1. The lower plate 23 also has a pair of laterally spaced lower apertures 29, 30 opening into the guide grooves 25, 26, respectively, for the passage of the respective sewing needles 21. The upper plate 24 has a pair of laterally spaced upper apertures 27, 28 vertically aligned with the lower apertures 29, 30, respectively, in the lower plate 23 for the passage of the respective sewing needles 21. The two needles 21, 21 are spaced apart from one another by a predetermined distance P.

Figure 14:
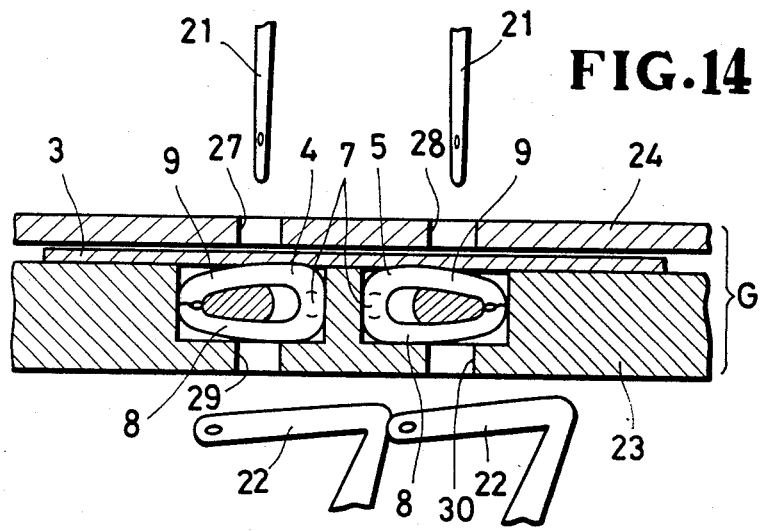
FIGS. 14 through 16 illustrate a method of manufacturing the water-resistant fastener stringer of each of FIGS. 5–11, using the guide of FIG. 13.
Figure 15:
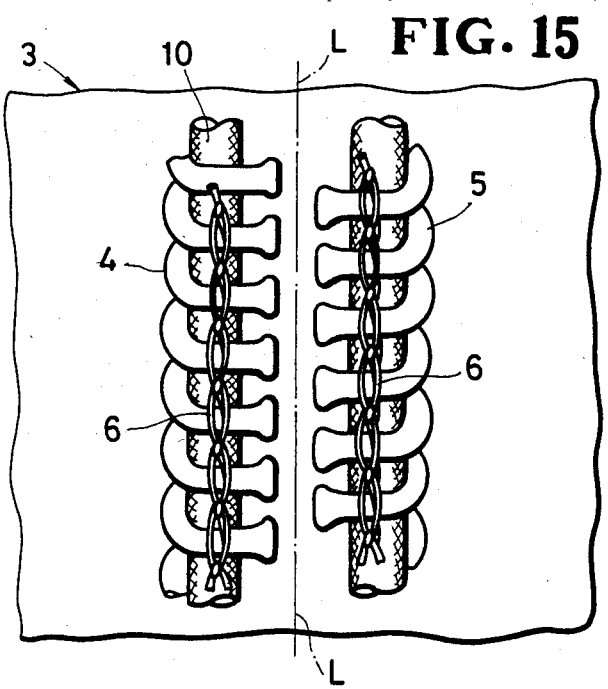
Figure 16:
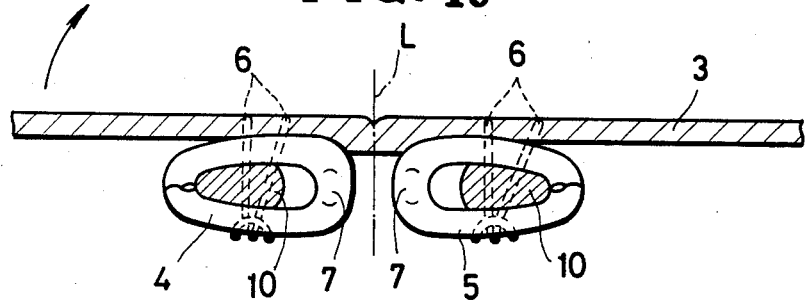

In FIG. 14, a pair of disengaged rows of coiled coupling elements 4, 5 is threaded through the pair of guide grooves 25, 26, respectively, in the lower plate 23 in such a position that the coupling heads 7 of one coupling element row 4 are disposed opposite to those of the other coupling element row 5 with a predetermined space therebetween. A continuous water-resistant strip 3 is placed between the upper and lower plates 23, 24 in such a position that the water-resistant surface of the strip 3 faces downwardly. Then the pair of rows of coupling elements 4, 5 is sewn to the water-resistant surface of the strip 3 on a sewing machine as shown in FIG. 15, during which time the sewing needles 21, 21 (each carrying a needle thread) are moved toward and away from the corresponding loopers 22, 22 (each carrying a looper thread) through the upper and lower apertures 27, 29; 28, 30 to form sewn stitches 6, such as double locked stitches, with the needle and looper threads. Thus the needle thread of each of the sewn stitches 6 extend through the strip 3 and then through the space between adjacent coupling elements of a respective row 4, 5, and are interlooped with the looper thread which extends over the upper legs 8 of the successive coupling elements of the respective row 4, 5. With the pair of coupling element rows 4, 5 mounted on its lower or water-resistant surface, the strip 3 is folded on itself into a pair of superposed strip halves along a longitudinal center line L (FIG. 16) to form a longitudinal contact edge 3b centrally between the two coupling element rows 4, 5. Finally, the opposed strip halves are joined together at their confronting element-free surfaces by applying heat and pressure, with a film 14 of thermoplastic synthetic resin sandwiched between the two strip halves. Alternatively, the confronting surfaces of the two strip halves may be bonded to one another by an adhesive.

Thus the water-resistant stringer 2 of each of FIGS. 5-10 can be produced with an improved rate of production, in part because the water-resistant support tape 3 per se can be provided easily and inexpensively without any large scale and complex apparatus and in part because the attaching of the coupling element rows 4, 5 can be performed on a conventional ordinary sewing machine with the use of the guide G1 which is very simple in construction and hence inexpensive. This method also guarantees high and uniform quality stringers for water-resistant slide fasteners.

Figure 17:
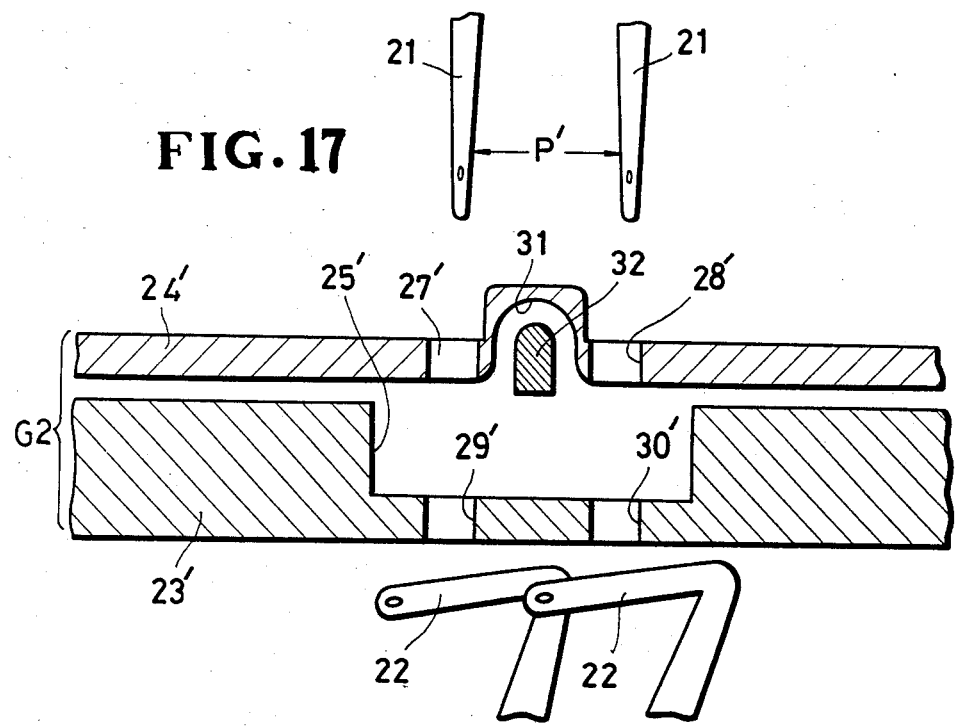
FIG. 17 is a fragmentary transverse cross-sectional view of a modified guide.

Using a guide G2 shown in FIGS. 17 and 18, the water-resistant stringer 2 of each of FIGS. 5-10 may also be produced in an alternative method described as follows.

The guide G2 comprises an elongate horizontal lower plate 23′ for supporting on its upper surface the water-resistant strip 3, and an upper plate 24′ coextensive with and parallel to the lower plate 23′, the upper and lower plates 24′, 23′ jointly defining therebetween a longitudinal guide passage for the water-resistant strip 3. The lower plate 23′ has in its upper surface a first longitudinal guide groove 25′ for receiving a pair of interengaged rows of coupling elements 4, 5. The lower plate 23′ also has a pair of laterally spaced lower apertures 29′, 30′ opening into the first guide groove 25′ for the passage of the respective sewing needles 21, 21. The two needles 21, 21 are spaced apart from one another by a predetermining distance P′. The upper plate 24′ has a pair of laterally spaced upper apertures 27′, 28′ vertically aligned with the lower apertures 29′, 30′, respectively, in the lower plate 23′ for the passage of the respective sewing needles 21, 21. The upper plate 24′ also has a downwardly facing second longitudinal guide groove 31 disposed between the upper apertures 27′, 28′ and in confronting relation to the first guide groove 25′ of the lower plate 23′. A liner 32 extends longitudinally through the second guide groove 31 of the upper plate 24′ so as to define therewith a longitudinal channel of inverted U-shaped cross section.

Figure 18:
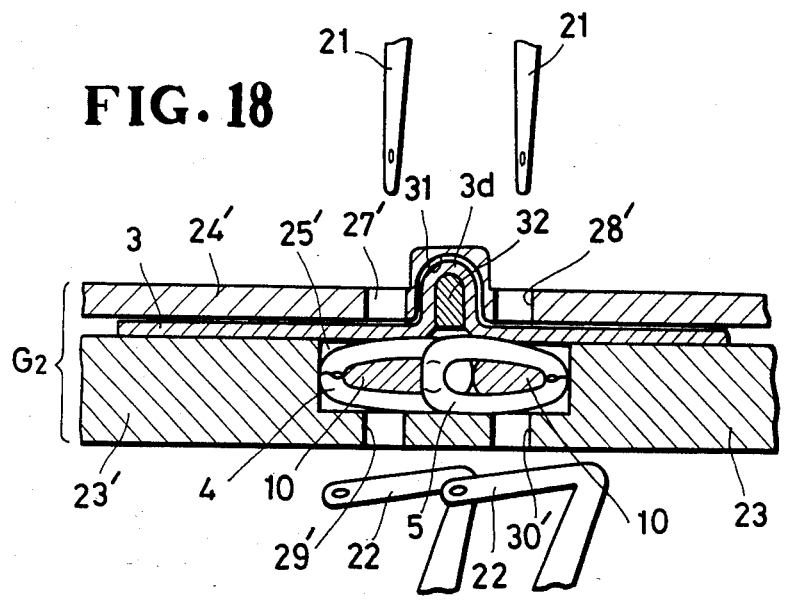
FIG. 18 illustrates another method of manufacturing the water-resistant fastener stringer of each of FIGS. 5–11, using the modified guide of FIG. 17.

In FIG. 18, a pair of interengaged rows of coiled coupling elements 4, 5 is threaded through the first guide groove 25′ in the lower plate 23′. A continuous water-resistant strip 3 is placed between the upper and lower plates 24′, 23′ in such a position that the water-resistant surface of the strip 3 faces downwardly, with a longitudinally extending central portion 3d of the strip 3 threaded through the channel defined in the second guide groove 31. Thus the central portion 3d of the strip 3 is received in the second guide groove 31 in a curved form to constitute a slack portion bulging from the strip 3 in an opposite direction to the coupling element rows 4, 5.

Then the pair of interengaged rows of coupling elements 4, 5 is sewn to the water-resistant surface of the strip 3 at opposite sides of the slack central portion 3d in the manner described above in connection with FIGS. 14 and 15. The opposed coupling element rows 4, 5 are disengaged and, at the same time, the slack portion 3d of the strip 3 is tautened. Thus a semi-product of FIG. 19 has been provided.

With the opposed coupling element rows 4, 5 mounted on the water-resistant surface of the strip 3 with a predetermined space between the two coupling element rows 4, 5, the strip 3 is folded on itself into a pair of superposed strip halves along the longitudinal center line L (FIG. 19) to form a longitudinal contact edge 3b centrally between the opposed coupling element rows 4, 5. Finally, the opposed strip halves are joined together at their confronting element-free surfaces in the manner described above.

Figure 19:
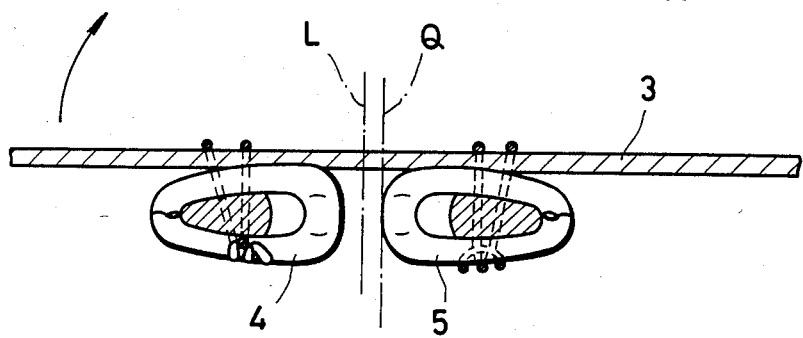
FIG. 19 illustrates the manner in which a water-resistant strip with a pair of coupling element rows attached thereto is folded on itself to provide the water-resistant stringer of FIG. 12.

To produce the water-resistant stringer 2 of FIG. 11, the strip 3 of the semi-product shown in FIG. 19 is folded on itself along a longitudinal off-center line Q so as to form a longitudinal inclined contact edge 3b between the opposed coupling element rows 4, 5.

Figure 20:
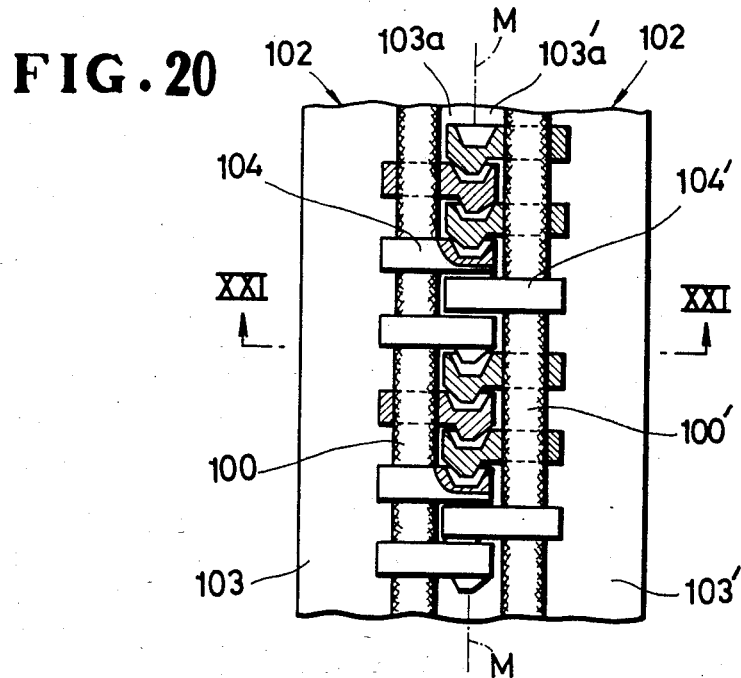
FIG. 20 is a fragmentary plan view, partly in cross-section, of a modified water-resistant slide fastener.
Figure 21:
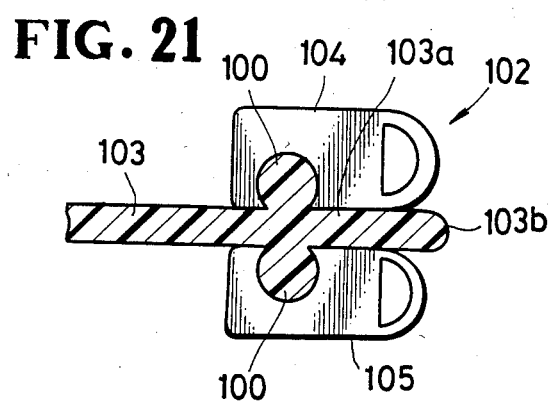
FIG. 21 is an enlarged transverse cross-sectional view taken along line XXI—XXI of FIG. 20, showing only one water-resistant fastener stringer.

FIG. 20 shows a pair of water-resistant stringers 102, 102' according to an eleventh embodiment, each stringer having a pair of rows of discontinuous coupling scoops 104, 105 (made of metal or synthetic resin) mounted on opposite surfaces of a water-resistant support tape 103, 103'. As shown in FIG. 21, the support tape 103 comprises a strip of water-resistant material such as natural or synthetic rubber or other elastomeric sythetic resin. The water-resistant strip 103 has on opposite surfaces a pair of longitudinal lugs 100, 100 extending along a marginal portion 103a of the strip 103. Each row of coupling scoops 104, 105 is secured to a respective one of the lugs 100 at uniform distances therealong.

Figure 22:
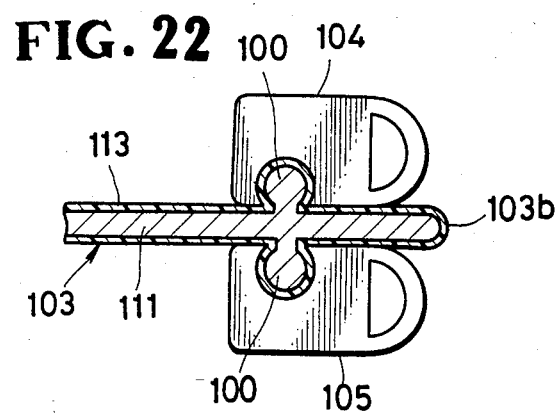
FIGS. 22 through 26 are transverse cross-sectional views showing various modifications of the water-resistant fastener stringer of FIG. 21, only FIG. 26 illustrating the same having been interengaged with a companion stringer.

FIG. 22 shows a twelfth embodiment in which the support tape 103 comprises a continuous core web or strip 111 of cloth covered on its whole surface by a layer 113 of water-resistant elastomeric material.

Figure 23:
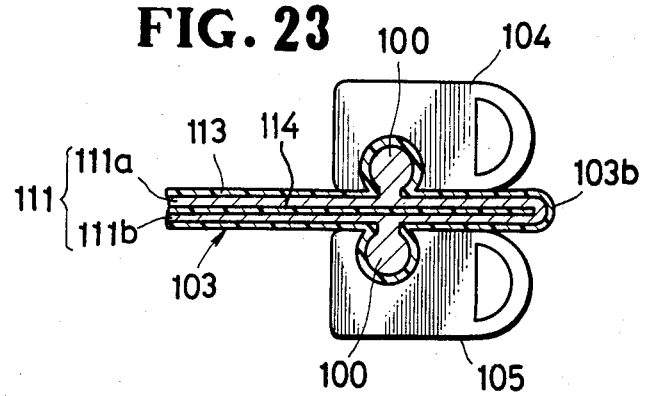
Figure 27:
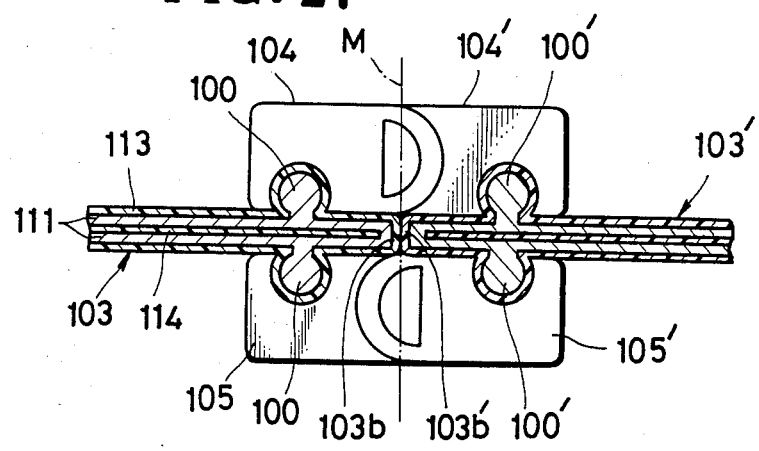
FIG. 27 illustrates the water-resistant fastener stringer of FIG. 23 as having been interengaged with a like companion stringer.

According to a thirteenth embodiment of FIG. 23, the support tape 103 comprises a continuous core web or strip 111 of cloth folded on itself into a pair of superposed strip halves 111a, 111b and covered on the whole surface, except inner surface, of each strip half 111a, 111b by the water-resistant layer 113. Each row of coupling scoops 104, 105 is mounted on the outer or covered surface of the respective strip half 111a, 111b. A film 114 of thermoplastic synthetic resin is sandwiched between the two strip halves 111a, 111b and is attached at opposite surfaces to the inner or non-covered surfaces of the two strip halves 111a, 111b in a well known manner such as by applying heat and pressure. Alternatively, the inner confronting surfaces of the two strip halves 111a, 111b may be bonded to one another by an adhesive. FIG. 27 illustrates the water-resistant stringer of FIG. 23 as having been interengaged with a like companion stringer.

Figure 24:
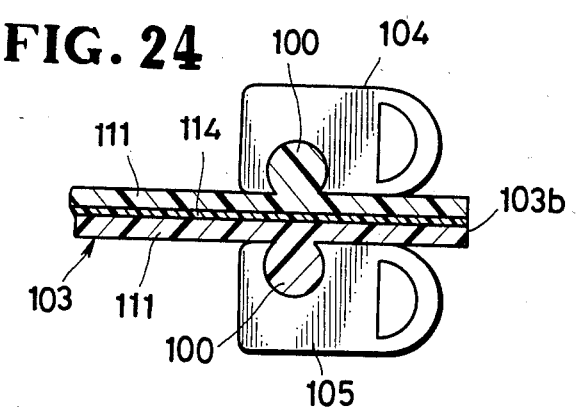

FIG. 24 shows a fourteenth embodiment in which the support tape 103 comprises a pair of superposed strips 111, 111 made of water-resistant elastomeric material. In production, each row of coupling scoops 104, 105 is mounted on the outer surface of a respective one of the upper and lower strips 111, 111. Then a film 114 of thermoplastic synthetic resin is sandwiched between the two strips 111, 111 and is attached at opposite faces to the inner confronting surfaces of the two strips 111, 111 in a well known manner such as by applying heat and pressure. Alternatively, the inner confronting surfaces of the two strips 111, 111 may be bonded to one another by an adhesive.

Figure 25:
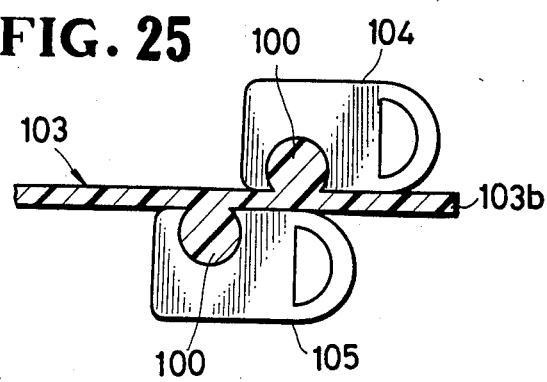
Figure 28:
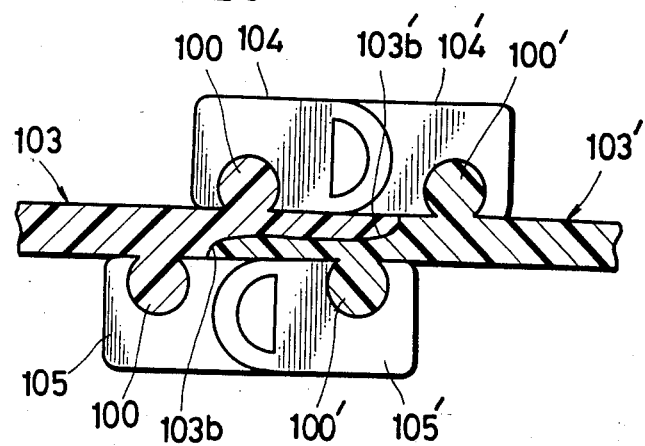
FIG. 28 illustrates the water-resistant fastener stringer of FIG. 25 as having been interengaged with a like companion stringer.

FIG. 25 shows a fifteenth embodiment in which the support tape 103 has on opposite surfaces a pair of longitudinal lugs 100, 100, the lugs being out of alignment with one another in a facewise direction of the support tape 103. Thus the upper and lower coupling scoop rows 104, 105 are out of alignment with one another in a facewise direction of the support tape 103. With this arrangement, as shown in FIG. 28, it is possible to provide the support tape 103 with a wide contact edge surface 103b which is engageable with a corresponding wide contact edge surface 103b' of a like companion support tape 103' in order to effect an improved water-tightness between the two support tapes 103, 103'.

Figure 26:
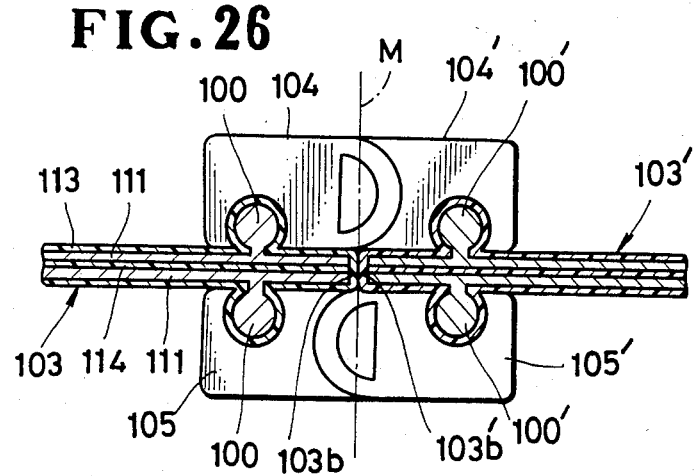

According to a sixteenth embodiment of FIG. 26, the support tape 103 comprises a pair of superposed strips 111, 111 of cloth, each strip being covered on its whole surface, except one or inner surface, by the water-resistant layer 113. In production, each row of coupling scoope 104, 105 is mounted on the outer or covered surface of a respective one of upper and lower strips 111, 111. Then a film 114 of thermoplastic synthetic resin is sandwiched between the two strips 111, 111 and is attached at opposite faces to the inner or non-covered surfaces of the two strips 111, 111 in a known manner such as by applying heat and pressure. Alternatively, the inner confronting surfaces of the two strips 111, 111 may be bonded to one another by an adhesive.

The water-resistant stringer of FIG. 23 is produced in the following manner. A pair of disengaged rows of coupling scoops 104, 105 is mounted on one or water-resistant surface of the strip 103 along the respective longitudinal lugs 100, 100 thereof. Then the strip 103 is folded on itself into a pair of superposed strip halves along a longitudinal center line L (FIG. 29) to form a longitudinal contact edge 103b centrally between the two coupling scoop rows 104, 105. Finally, the opposed strip halves are joined together at their confronting scoop-free surfaces by applying heat and pressure, with a film 114 of thermoplastic synthetic resin sandwiched between the two strip halves. Alternatively, the confronting surfaces of the two strip halves may be bonded to one another by an adhesive.

Figure 29:
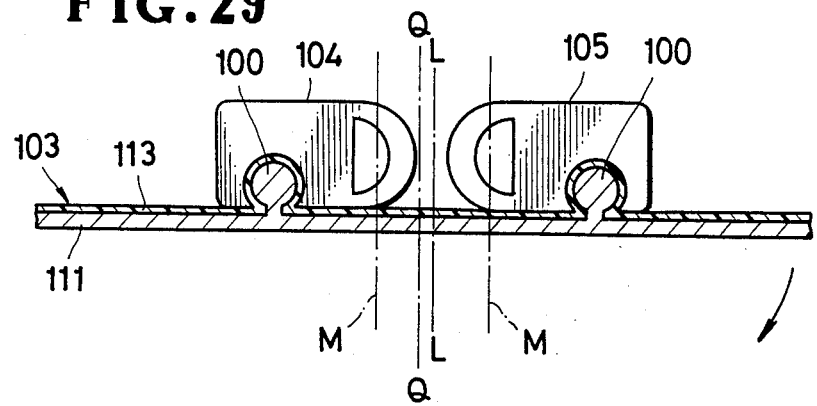
FIG. 29 illustrates the manner in which a water-resistant strip with a pair of coupling element rows attached thereto is folded on itself to provide the water-resistant fastener stringer of FIG. 23.

To provide an inclined contact edge 103b, the strip 103 of the semi-product shown in FIG. 29 is folded on itself along a longitudinal off-center line Q between the opposed coupling scoop row 104, 105.

In any one of the embodiments described above, since the water-resistant stringer 2, 102 has a pair of rows of coupling elements 4, 5; 104, 105 mounted on opposite surfaces of a water-resistant support tape 3, 103, the contact edge 3b, 103b of the support tape 3, 103 is engageable with a corresponding contact edge 3b', 103b' of a like companion stringer's support tape 3', 103' with improved water-tightness as the opposed stringers 2, 2'; 102, 102' are coupled together. Further, because of this double-coupling construction, the water-resistant slide fastener of the present invention can maintain an adequate degree of water-tightness even when thrusting force is exerted on the slide fastener from either facewise direction.

Although various minor modifications may be suggested by those versed in the art, it should be understood that we wish to embody within the scope of the patent warranted hereon, all such embodiments as reasonably and properly come within the scope of our contribution to the art.

What is claimed is:

1. A water-resistant slide fastener stringer comprising:
   (a) a water-resistant support tape having a longitudinal marginal portion having a contact edge adapted to engage a corresponding contact edge of a like companion stringer's support tape to effect a water-tightness between such two stringers, said support tape comprising a core web of a strip of cloth and a layer of water-resistant material covering the whole surface of said core web, said cloth strip being folded on itself into a pair of superposed strip halves;
   (b) a film of thermoplastic synthetic resin sandwiched between the opposed cloth strip halves and attached at opposite surfaces to confronting surfaces of the opposed cloth strip halves, respectively;
   (c) a pair of rows of coupling elements mounted on opposite surfaces of said support tape along said marginal portion, said pair of rows of coupling elements being engageable with a pair of rows of coupling elements, respectively, of the companion stringer across an intermediate line of mutual engagement; and (d) said contact edge of said support tape, in its free form, projecting transversely beyond said intermediate line when the opposed coupling element rows of the two stringers are out of mutual engagement.

2. A water-resistant slide fastener stringer according to claim 1, said contact edge of said support tape having a surface complementary to a corresponding contact edge surface of the companion stringer's support tape.

3. A water-resistant slide fastener stringer according to claim 2, said contact edge surface of said support tape being laterally inclined.

4. A water-resistant slide fastener stringer according to claim 1, said cloth strip comprising a knit fabric composed of tricot stitches having on its inner surface a plurality of longitudinal wales and interwale grooves.

5. A water-resistant slide fastener stringer according to claim 1, each row of said coupling elements comprising a continuous coiled filament attached to said support tape by sewn stitches, said pair of coupling element rows being out of alignment with one another in a facewise direction of said support tape.

6. A water-resistant slide fastener stringer according to claim 1, said support tape having on opposite surfaces a pair of longitudinal lugs extending along said marginal portion through the entire length of said tape, each row of said coupling elements comprising a succession of discontinuous scoops secured to a respective one of said lugs at uniform distances therealong.

7. A water-resistant slide fastener stringer comprising:

(a) a water-resistant support tape having a longitudinal marginal portion having a contact edge adapted to engage a corresponding contact edge of a like companion stringer's support tape to effect a water-tightness between such two stringers, said support tape comprising a core web and a layer of water-resistant material covering the whole surface of said core web, said core web comprising a pair of superposed strips of cloth;

(b) a film of thermoplastic synthetic resin sandwiched between the opposed cloth strips and attached at opposite surfaces to confronting surfaces of the opposed cloth strips, respectively;

(c) a pair of rows of coupling elements mounted on opposite surfaces of said support tape along said marginal portion, said pair of rows of coupling elements being engageable with a pair of rows of coupling elements, respectively, of the companion stringer across an intermediate line of mutual engagement; and (d) said contact edge of said support tape, in its free form, projecting transversely beyond said intermediate line when the opposed coupling element rows of the two stringers are out of mutual engagement.

8. A water-resistant slide fastener stringer according to claim 7, said support tape having on opposite surfaces a pair of longitudinal lugs extending along said marginal portion through the entire length of said tape, each row of said coupling elements comprising a succession of discontinuous scoops secured to a respective one of said lugs at uniform distances therealong.

* * * * *